United States Patent [19]

Pistilli

[11] Patent Number: 5,307,241
[45] Date of Patent: Apr. 26, 1994

[54] ELECTRONIC CIRCUIT BOARD ARRANGEMENTS INCLUDING MAIN AUXILIARY CIRCUIT BOARDS

[75] Inventor: Antonio Pistilli, Stittsville, Canada

[73] Assignee: Northern Telecom Limited, Montreal, Canada

[21] Appl. No.: 37,150

[22] Filed: Mar. 25, 1993

[51] Int. Cl.⁵ .............................................. H05K 1/11
[52] U.S. Cl. .................................... 361/784; 361/761; 361/792; 174/261; 257/786
[58] Field of Search ............... 361/395, 397, 398, 400, 361/401, 412, 414, 417, 736, 748, 749, 752, 760, 761, 763, 807; 174/255, 257, 260, 261, 262; 257/784, 786, 692, 686; 439/78

[56] References Cited

U.S. PATENT DOCUMENTS

| | | | |
|---|---|---|---|
| 4,674,182 | 6/1987 | Igarashi | 29/837 |
| 4,731,704 | 3/1988 | Lochner | 361/400 |
| 5,001,604 | 3/1991 | Lusby | 361/398 |
| 5,027,255 | 6/1991 | Zeitlin et al. | 361/395 |
| 5,126,920 | 6/1992 | Cardashian et al. | 361/398 |
| 5,216,581 | 6/1993 | Fisher et al. | 361/392 |

Primary Examiner—Leo P. Picard
Assistant Examiner—Young Whang
Attorney, Agent, or Firm—R. John Haley

[57] ABSTRACT

A electronic circuit board arrangement includes a main circuit board on which components are mounted, with component leads passing through holes in this board. Additional components are provided on an auxiliary circuit board at least part of which is directly against the main board, either on the component side underlying components or on a soldering side of the main board. The additional components are connected to the component leads via conductive tracks on the auxiliary board. The auxiliary board can be flexible to also extend over components on the main board. The arrangement is particularly useful for adding additional components to an original circuit design.

11 Claims, 2 Drawing Sheets

ELECTRONIC CIRCUIT BOARD ARRANGEMENTS INCLUDING MAIN AUXILIARY CIRCUIT BOARDS

This invention relates to electronic circuit board arrangements.

BACKGROUND OF THE INVENTION

It is well known, especially in the field of telecommunications, to provide electronic circuits on printed circuit boards which are accommodated within an equipment frame, the boards including connectors via which electrical connections are made for example to backplane connectors in the equipment frame. Such an arrangement dictates the size and spacing of the circuit boards.

Evolution of electronic equipment has led to increasingly complex circuits, for example including microprocessors operating at high speeds, to a very high density of components, and to the use of multi-layer circuit boards to accommodate dense conductor patterns, so-called "daughter" boards perpendicular to a main board, and surface mounted components on both sides of the circuit boards. While the use of very large scale integrated circuits has facilitated such evolution, there are still many discrete components, such as transformers, relays, power transistors, large-magnitude capacitors, and precision resistors, which must be accommodated on electronic circuit boards. By way of example, a programmable line interface circuit for telephone lines may incorporate all of these components.

It is almost inevitable that any electronic circuit is subject to revision or improvement after it is initially designed. This is especially the case with circuits, such as telephone line interface circuits, which must be used in a wide variety of differing operating situations and conditions. Often minor revisions or improvements prove to be desirable. While in the long term such changes can be incorporated into a redesign of the physical implementation of the electronic circuit, in the short term this is impractical. Accordingly, such changes have frequently been implemented in the past by electronic "barnacles" on the circuit. An electronic barnacle typically involves the addition of a few components connected into the original design of the circuit.

Electronic barnacles tend to be unsightly and are expensive to implement, because they involve manual modifications of the circuit. While the cost of manually modifying a few circuits may not be great, the costs of manually modifying circuits manufactured in large quantities may be prohibitive.

Furthermore, the high density of components of the circuit, combined with the constraints on its size, may leave virtually no room for components to be added manually to the circuit, because typically the whole area of both sides of the circuit board is fully occupied by components and connections of the original design. Gaining access to points for connecting additional components may also be very difficult or inconvenient. Generally, connection leads of any manually added components must be carefully insulated, involving further manual steps.

Accordingly, a need exists to provide an improved arrangement which facilitates making minor revisions to an electronic circuit design.

SUMMARY OF THE INVENTION

According to one aspect of this invention there is provided a circuit board arrangement comprising: a main circuit board for carrying and interconnecting a plurality of components of an electronic circuit; an auxiliary circuit board having at least a part thereof parallel to and directly adjacent to the main circuit board, the auxiliary circuit board having in said part thereof a plurality of holes aligned with holes in the main circuit board; and a plurality of conductors extending through the aligned holes and making electrical connections with conductive tracks on both the main and the auxiliary circuit boards.

The auxiliary circuit board in such an arrangement can provide desired connections in or to a circuit design in a convenient manner, while taking very little space. It can provide such connections separately from those provided by the main circuit board, and can carry additional components, for example in surface mounted form. It can be provided on either a soldering face or a component face of the main circuit board. In the latter case it can underlie components on the main circuit board, and it can be a flexible board which also extends over components on the main circuit board to provide extra space for additional components to be mounted and interconnected. Furthermore, the arrangement is well suited to automated manufacturing procedures, so that labour costs associated with manual labour can be substantially reduced.

Another aspect of this invention provides a circuit board arrangement comprising: a main circuit board carrying and interconnecting a plurality of components of an electronic circuit; an auxiliary circuit board underlying one or more of said components, the auxiliary circuit board having therein holes aligned with holes in the main circuit board, component leads of the one or more of said components passing through the aligned holes; one or more additional components on the auxiliary circuit board; and conductive tracks on the auxiliary circuit board connecting said one or more additional components to component leads passing through the aligned holes.

A further aspect of this invention provides a circuit board arrangement comprising: a main circuit board having a first face accommodating a plurality of components of an electronic circuit and a second face for soldering of electrical connections for said circuit; a flat auxiliary circuit board directly adjacent to the second face of the main circuit board and having a plurality of holes aligned with holes in the main circuit board through which component leads of one or more of said components pass; one or more additional components on that face of the auxiliary circuit board which is furthest from the main circuit board; and conductive tracks on the auxiliary circuit board connecting said one or more additional components to component leads passing through the aligned holes.

BRIEF DESCRIPTION OF THE DRAWINGS

The invention will be further understood from the following description with reference to the accompanying drawings, in which.

DETAILED DESCRIPTION

Figure 1:
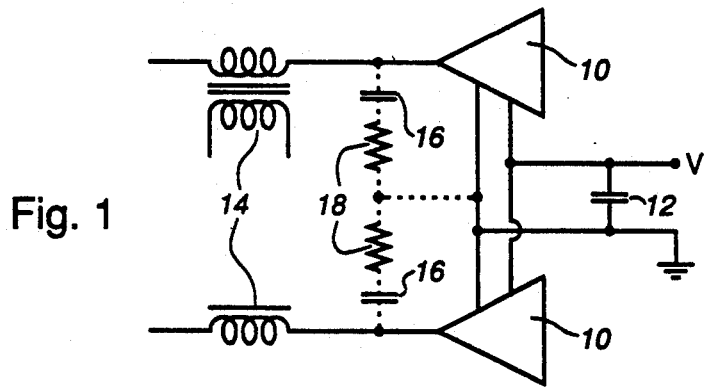
FIG. 1 illustrates part of an electronic circuit with reference to which the invention is explained.

The circuit of FIG. 1 is used purely by way of example, and the invention is applicable to any electronic circuit.

Referring to FIG. 1, part of a telephone line interface circuit is shown including two amplifiers 10, with voltage supply lines connected to a supply voltage V and ground, a decoupling capacitor 12 connected between the voltage supply lines, and a transformer 14 having windings connected to outputs of the amplifiers. Additional components, shown with broken-line connections, comprising a series-connected capacitor 16 and resistor 18 connected between the output of each amplifier 10 and ground, are not part of an original design of the circuit but constitute an improvement which it is desired to implement.

Figure 2:
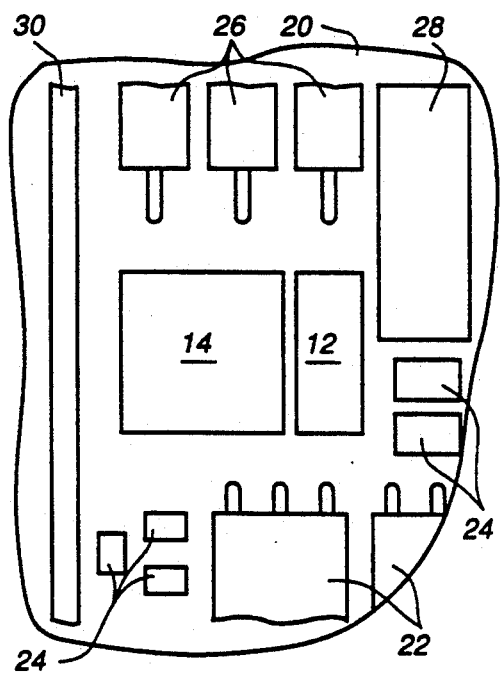
FIG. 2 is a plan view illustrating an arrangement of parts of the circuit of FIG. 1 on a main circuit board.

FIG. 2 illustrates an original design arrangement of parts of the telephone line interface circuit on a multilayer circuit board 20 only part of which is shown. FIG. 2 shows the capacitor 12 and the transformer 14 (the amplifiers 10 are not shown in FIG. 2), and also illustrates other components of the interface circuit, including power transistors 22, surface mounted discrete components 24, leaded components such as power diodes 26, a capacitor 28, and a thick film resistor component 30 arranged as a single in-line package perpendicular to the main circuit board 20. The various components are interconnected via conductors (not shown) in the various layers of the circuit board 20.

The original design arrangement of FIG. 2 provides a high density of components on the circuit board 20. This high component density applies over the entire area of the circuit board, and many of the components extend to close to a maximum height from the board, as dictated by the spacing of boards in use in an equipment frame. In consequence, manually adding the components 16 and 18 to the circuit poses a problem in finding space in which such components can be accommodated.

This problem is compounded by the need to connect these components into the circuit as shown in FIG. 1. Connection pins of the transformer 14 extend directly from beneath this component through holes in the board 20, and so are inaccessible from the upper side of the board shown in FIG. 2. The same may apply to the outputs of the amplifiers 10, so that the interconnections between the amplifier outputs and the transformer windings may be completely inaccessible from the upper side of the board. It is not practical to provide extra holes through the board 20 to provide for the additional connections of the capacitors 16, especially because of the multiple layers of the board 20.

Although the desired connection points are accessible on the underside of the board 20, there may be insufficient height on that side of the board to accommodate the additional components, and in any event the leads of such components would have to be electrically insulated, and the additional components mechanically secured in place, to avoid electrical and mechanical problems. In addition, extra manufacturing costs would be incurred due to the manual labour involved in adding the additional components after manufacture of the circuit in an automated manufacturing process.

Thus there are significant difficulties in attempting to add the components 16 and 18 to the original design arrangement of the circuit.

Figure 4:
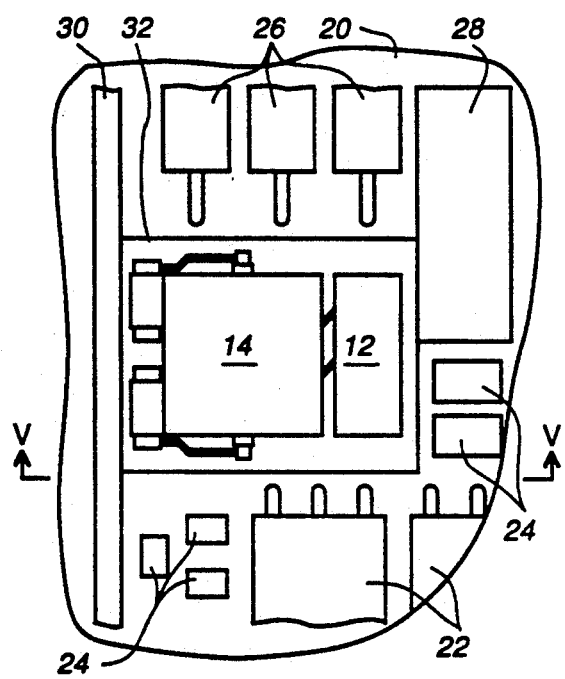
FIG. 4 is a plan view illustrating an arrangement of parts of the circuit of FIG. 1 on the main and auxiliary circuit boards in accordance with an embodiment of the invention.
Figure 3:
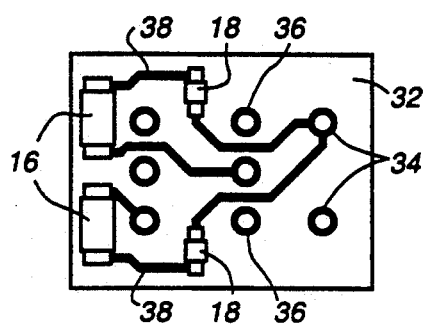
FIG. 3 is a plan view illustrating an auxiliary circuit board with surface mounted components on it.
Figure 5:
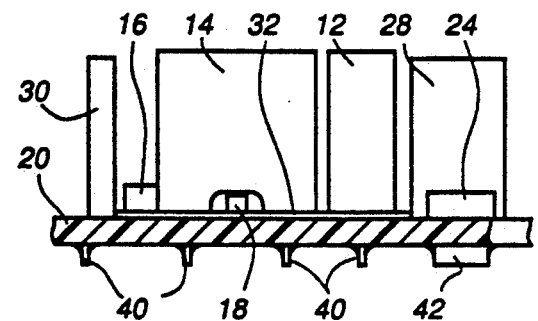
FIG. 5 is a partial cross-sectional view of the arrangement of FIG. 4, the cross-section being taken on lines V—V in FIG. 4.

The invention overcomes these difficulties in the manner described below using an auxiliary circuit board 32, which is illustrated in FIG. 3 and which is arranged in conjunction with the main circuit board 20 as shown in FIGS. 4 and 5. As illustrated in these figures, the auxiliary circuit board 32 is a very thin board which is sized and positioned to fit directly adjacent to the upper surface of the main circuit board 20 underlying the capacitor 12 and the transformer 14.

Referring to FIG. 3, the auxiliary circuit board 32 has two holes 34 which are aligned with holes in the main circuit board 20 for the leads of the capacitor 12, and six holes, two of which are referenced 36, which are aligned with holes in the main circuit board 20 for the pins of the transformer 14. Conductive tracks 38 are printed on the upper surface of the board 32 to extend between solder pads, for connection of the additional components 16 and 18 in surface mounted form, and plated-through connections at the holes for those pins of the transformer 14, and at the hole for the ground connection lead of the capacitor 12, to which it is desired that the additional components 16 and 18 be connected as shown in FIG. 1. As illustrated in FIG. 3 all of the holes in the board 32 are plated-through holes, but this need not be the case.

The surface mounted capacitors 16 and resistors 18 are fixed to the board 32 and soldered to their respective solder pads using conventional, possibly automated, techniques, so that these additional components 16 and 18 and the board 32 together constitute an integrated module for assembly with and connection to the main circuit board 20, again using automated techniques. It should be noted that this arrangement facilitates the use of surface mounted forms of the additional components, which are much smaller than leaded components which would have to have been used to add these components manually using prior art techniques. Consequently, it is less difficult to accommodate the components within the small spaces available.

On assembly of the main circuit board 20, the module comprising the auxiliary circuit board 32 with the additional components 16 and 18 on it is positioned as shown in FIG. 4, and the capacitor 12 is mounted with its connection leads passing through the holes 34 in the board 32 and through the aligned holes in the board 20, and the transformer 14 is mounted with its connection pins passing through the holes 36 in the board 32 and through the aligned holes in the board 20. These leads and pins, or conductors, are soldered in conventional manner by wave soldering of the whole board 20. FIG. 5 illustrates the resulting soldered connections 40 on the underside of the board, and also shows that other surface mounted components 42 may also be provided and connected on this side of the board.

In view of the thinness of the board 32 and its position directly adjacent to the main board 20, the wave soldering process not only solders the connections of the main board 20 but also solders the leads of the capacitor 12 and the pins of the transformer 14 to the plated through holes 34 and 36 in the auxiliary board 32. As a result, the additional components 16 and 18 are soldered into the circuit as is desired. The correlation between the connections of these components in FIG. 1 and the connections via the tracks 38 in FIG. 3 can be seen from the drawings.

Even with the small size of the surface mounted components 16 and 18, it can be seen from FIGS. 4 and 5 that the resistors 18 are accommodated partially underlying the transformer 14, in an already existing recess between the connection pins of the transformer.

As shown by FIG. 5, the height of the capacitor 12 and transformer 14 above the main board 20 is increased by the thickness of the auxiliary board 32, which for this reason is made as thin as possible. For example, the board 32 may have a thickness of about 0.5 mm.; such an increase in height of components above the board 20 is commensurate with component size tolerances and generally can be accommodated within the size constraints for the overall circuit.

Figure 6:
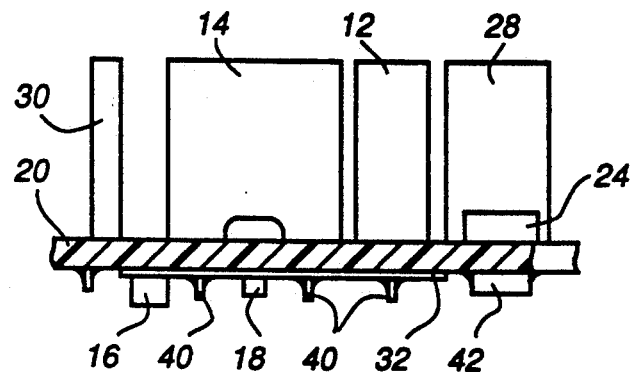
FIG. 6 is a view similar to FIG. 5 of an alternative arrangement of main and auxiliary circuit boards in accordance with another embodiment of the invention.

FIG. 6 illustrates an alternative arrangement in which a similar module comprising an auxiliary circuit board 32 is provided on the underside of the main circuit board 20, with its tracks on its lower surface (and arranged as a mirror image of the illustration in FIG. 3, to provide the correct connections) and the surface mounted additional components 16 and 18 provided on this lower surface. This arrangement has the advantage that the additional components 16 and 18 can be soldered to their solder pads on the board 32 in the same wave soldering step as used for soldering the entire board 20, but may be more difficult to accomplish physically especially in regions of the main board 20 which are already crowded with connections and/or components. Obviously in the arrangement of FIG. 6 the auxiliary board 32 can not be allowed to cover connections to be soldered or components 42 on the underside of the main board 20, but apertures could be provided in the auxiliary board 32 for such connections and/or components, and/or additional plated through holes may be provided in the auxiliary board 32, in the same manner as the holes 34 and 36, to ensure soldering of connections in the wave soldering process.

Figure 7:
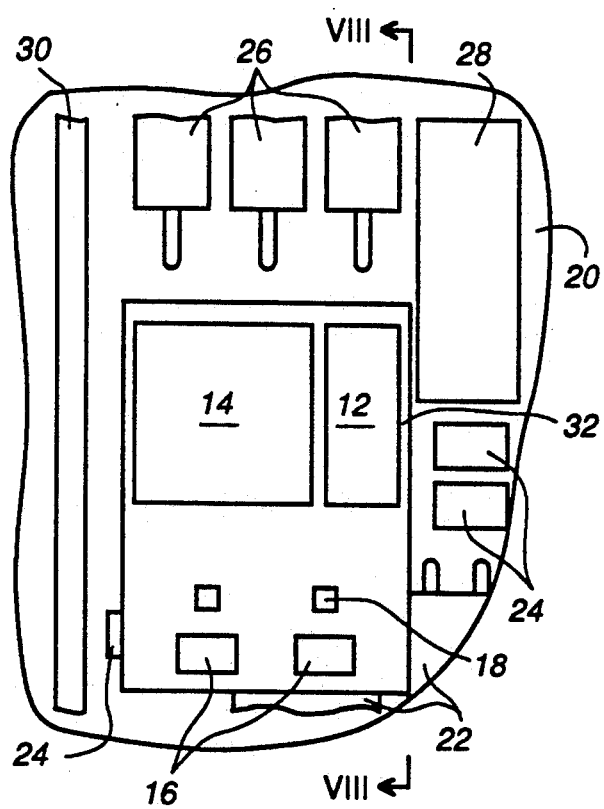
FIG. 7 is a plan view illustrating another arrangement of main and auxiliary circuit boards in accordance with another embodiment of the invention.
Figure 8:
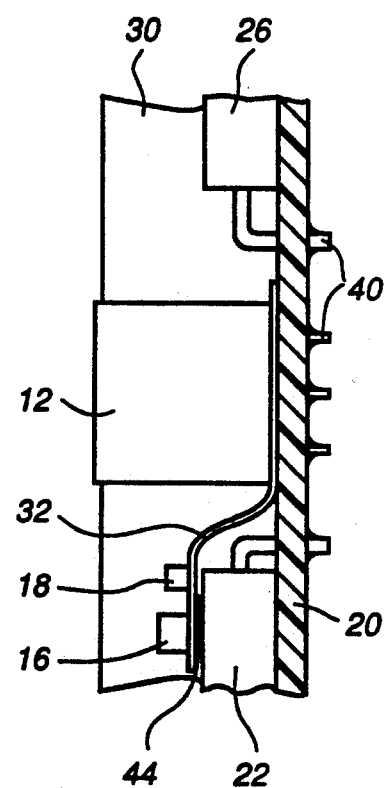
FIG. 8 is a partial cross-sectional view of the arrangement of FIG. 7, the cross-section being taken on lines VIII—VIII in FIG. 7.

FIGS. 7 and 8 illustrate a further alternative arrangement which is useful where there is space for the additional components 16 and 18 near, but not directly adjacent to, the components 12 and 14 to which the additional components must be connected. In this alternative arrangement, the auxiliary circuit board 32 is a flexible board which extends under the capacitor 12 and transformer 14 as described above and over nearby components 22 to which it is mechanically secured for example by adhesive 44. The additional components 16 and 18 are provided on such a flexible board 32 and connected via tracks on the upper surface of the board 32 to the components 12 and 14 in the same manner as described above.

It can be seen especially from the illustrations in FIGS. 5, 6, and 8 of the drawings that the auxiliary circuit board 32 effectively provides an additional connection layer in the regions of the main board where it is provided. While this has been described above in relation to the addition of components to an original circuit design, it can be seen that it is equally applicable to the addition of connections which may be desired without any additional components, and also to the provision of components and/or connections in an original circuit design. For example, an original circuit design may include one or more such auxiliary circuit boards with additional components to achieve an even greater component density, and/or to provide connections between connection points on the main circuit board. Such connections may reduce the number of connection layers which might otherwise be required in the main, multi-layer, board, or may serve to separate certain connection paths (e.g. paths carrying relatively high voltages) from the majority of connection paths provided via the main circuit board. Furthermore, it can easily be seen that the auxiliary circuit board may itself be a multi-layer circuit board if desired, and may include grounded shielding layers as well as desired connection paths.

In addition, although as described above the auxiliary circuit board 32 is connected via the connection pins or leads of components on the main board 20, it may be connected to any conductors which provide appropriate connections and which pass through holes in the main board and aligned holes in the auxiliary board, regardless of whether these conductors are component connection leads, test pins, or other connection paths.

As already described, the additional components 16 and 18 can be mounted on and soldered to the auxiliary circuit board 32 to form a module which is then assembled with the main circuit board 20. Alternatively, the auxiliary circuit board 32 can be glued in its desired position on the main circuit board with the holes in alignment, and the additional components 16 and 18 subsequently added along with the components 12, 14, etc. As a further, and possibly preferred, alternative at least for the arrangement of FIGS. 3 to 5, the components 12 and 14 and the additional components 16 and 18 may first all be soldered to the auxiliary circuit board 32 to form a composite component, and this composite component may then be assembled with and secured to the main circuit board 20 in an automated assembly process.

Thus although particular embodiments of the invention have been described in detail, it should be appreciated that numerous modifications, variations, and adaptations may be made without departing from the scope of the invention as defined in the claims.

What is claimed is:

1. A circuit board arrangement comprising:
   a main circuit board for carrying and interconnecting a plurality of components of an electronic circuit;
   an auxiliary circuit board having at least a part thereof parallel to and directly adjacent to the main circuit board, the auxiliary circuit board having in said part thereof a plurality of holes aligned with holes in the main circuit board;
   a plurality of conductors extending through the aligned holes and making electrical connections with conductive tracks on both the main and the auxiliary circuit boards; and
   wherein at least said part of the auxiliary circuit board which is parallel to and directly adjacent to the main circuit board is positioned between the main circuit board and at least one component on the main circuit board, and at least one of said plurality of conductors is constituted by a lead of said at least one component passing through the aligned holes.

2. An arrangement as claimed in claim 1 and including one or more components on the auxiliary circuit board electrically connected to the conductive tracks on the auxiliary circuit board.

3. An arrangement as claimed in claim 2 wherein said one or more components on the auxiliary circuit board comprises at least one surface mounted component on that face of the auxiliary circuit board which is furthest from the main circuit board.

4. An arrangement as claimed in claim 1 wherein the auxiliary circuit board comprises a flat board directly adjacent to the main circuit board.

5. An arrangement as claimed in claim 1 wherein the auxiliary circuit board comprises a flexible board having a further part which extends over at least another component on the main circuit board.

6. An arrangement as claimed in claim 5 and including one or more components on the auxiliary circuit board electrically connected to the conductive tracks on the auxiliary circuit board.

7. An arrangement as claimed in claim 6 wherein said one or more components on the auxiliary circuit board comprise at least one surface mounted component on that face of the auxiliary circuit board which is furthest from the main circuit board.

8. A circuit board arrangement comprising:
   a main circuit board carrying and interconnecting a plurality of components of an electronic circuit;
   an auxiliary circuit board between the main circuit board and one or more of said components, the auxiliary circuit board having therein holes aligned with holes in the main circuit board, component leads of the one or more of said components passing through the aligned holes;
   one or more additional components on the auxiliary circuit board; and
   conductive tracks on the auxiliary circuit board connecting said one or more additional components to component leads passing through the aligned holes.

9. An arrangement as claimed in claim 8 wherein said one or more additional components comprise at least one surface mounted component on the auxiliary circuit board.

10. An arrangement as claimed in claim 8 wherein the auxiliary circuit board comprises a flexible board which also extends over at least another component on the main circuit board.

11. An arrangement as claimed in claim 8 wherein said one or more additional components comprise at least one surface mounted component on the auxiliary circuit board.

* * * * *

UNITED STATES PATENT AND TRADEMARK OFFICE
CERTIFICATE OF CORRECTION

PATENT NO. : 5,307,241
DATED : April 26, 1994
INVENTOR(S) : Antonio Pistilli

It is certified that error appears in the above-identified patent and that said Letters Patent is hereby corrected as shown below:

On the Cover Page, in the Title [54], insert --AND--, after "MAIN"

Signed and Sealed this

Twentieth Day of September, 1994

Attest:

BRUCE LEHMAN

*Attesting Officer*  *Commissioner of Patents and Trademarks*